(12) United States Patent
Izumi et al.

(10) Patent No.: US 9,521,773 B2
(45) Date of Patent: Dec. 13, 2016

(54) ELECTRONIC DEVICE

(71) Applicant: YOKOGAWA ELECTRIC CORPORATION, Musashino-shi, Tokyo (JP)

(72) Inventors: Hayato Izumi, Musashino (JP); Hiroki Kuraishi, Musashino (JP); Yasuhiro Owaki, Musashino (JP); Takahiro Tsutsumi, Musashino (JP); Koichiro Shimamura, Musashino (JP)

(73) Assignee: YOKOGAWA ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/613,764

(22) Filed: Feb. 4, 2015

(65) Prior Publication Data

US 2015/0223362 A1 Aug. 6, 2015

(30) Foreign Application Priority Data

Feb. 5, 2014 (JP) ................. 2014-020524

(51) Int. Cl.
*H05K 7/12* (2006.01)
*H05K 7/20* (2006.01)
*H05K 7/14* (2006.01)
*H02B 1/052* (2006.01)

(52) U.S. Cl.
CPC ............. *H05K 7/12* (2013.01); *H05K 7/1462* (2013.01); *H05K 7/2039* (2013.01); *H02B 1/0523* (2013.01); *H02B 1/0526* (2013.01)

(58) Field of Classification Search
CPC ...... H05K 7/12; H05K 7/1462; H05K 7/1474; H05K 7/2039; H02B 1/0526; H02B 1/0523; H06F 3/0658; G06F 13/40; G06F 3/1279

USPC .......................... 361/709, 732, 697
See application file for complete search history.

(56) References Cited

U.S. PATENT DOCUMENTS 6,834,765 B1 * 12/2004 Leitl ...................... H02B 1/052
211/26
7,666,005 B2 * 2/2010 Heggemann ......... H05K 7/1469
361/730
2012/0045913 A1 * 2/2012 Bodmann ............ H05K 7/1468
439/153
2013/0322044 A1 12/2013 Kusumi et al.
(Continued)

FOREIGN PATENT DOCUMENTS

DE 29710310 U1 9/1997
DE EP 1480307 A1 * 11/2004 ............. H02B 1/052
(Continued)

OTHER PUBLICATIONS

Search Report dated Jul. 16, 2015, issued by the European Patent Office in counterpart European Application No. 15153182.9.

*Primary Examiner* — Stephen Sul
(74) *Attorney, Agent, or Firm* — Sughrue Mion, PLLC (57) ABSTRACT

An electronic device includes a base plate, a plurality of modules detachably fitted and connected to the base plate, a plurality of mounting members configured to detachably mount the base plate to a DIN rail, and an operation lever provided on the base plate and configured to be engaged with the mounting members and to be operable from a front surface of the base plate. When the operation lever is operated, an engaged state between the mounting members and the DIN rail is released.

9 Claims, 13 Drawing Sheets

(56) References Cited

U.S. PATENT DOCUMENTS

2014/0118958 A1* 5/2014 Hamada ............... H05K 7/1474
  361/728

FOREIGN PATENT DOCUMENTS

| EP | 2677846 A1 | 12/2013 |
|---|---|---|
| JP | 61120496 A | 6/1986 |
| JP | 7254447 A | 10/1995 |
| JP | 11233980 A | 8/1999 |
| JP | 2011023437 A | 2/2011 |
| JP | 2012-134352 A | 7/2012 |

* cited by examiner

ELECTRONIC DEVICE

CROSS-REFERENCE TO RELATED APPLICATION

The present application claims priority from Japanese Patent Application No. 2014-020524 filed on Feb. 5, 2014, the entire content of which is incorporated herein by reference.

BACKGROUND

Technical Field

The present disclosure relates an electronic device, and more particularly, to an electronic device configured to detachably mount a base plate, to which a plurality of modules is detachably fitted and connected, to a DIN rail through a plurality of mounting members.

Related Art

An electronic device has been known which is configured to detachably mount a base plate, to which a plurality of modules is detachably fitted and connected, to a DIN rail through a plurality of mounting members.

Figure 10:
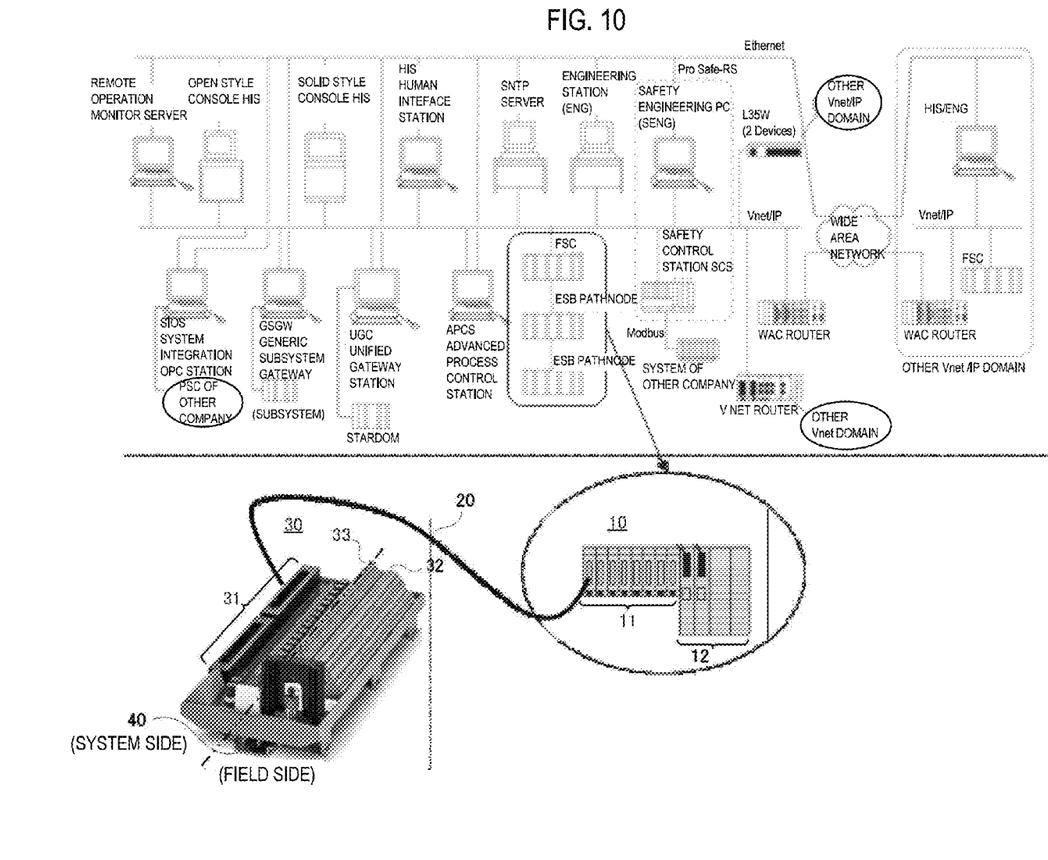
FIG. 10 is a block diagram showing an example of a control system of the related art.

FIG. 10 is a block diagram illustrating an example of a control system configured using the electronic device. In FIG. 10, a field control station 10 includes a plurality of input/output modules 11 and a variety of functional modules 12 such as a power supply module, a control module configured to control transmission and reception of various signals to and from an upper system, and the like. The input/output modules 11 and the functional modules 12 are detachably fitted and connected to a first terminal board provided for a base plate (not shown).

The field control station 10 is connected to a second terminal board 30 through a cable 20. The second terminal board 30 is provided with a connector 31, a terminal block 32, a disconnection member 33, and the like. The cable 20 of a system-side is detachably fitted and connected through a connector (not shown) to the connector 31. A wiring of a field device such as a sensing device, a motor, a valve and the like (not shown) of a field-side is connected to the terminal block 32. The disconnection member 33 is configured to mechanically disconnect a signal system for mechanically and electrically connecting the connector 31 and the terminal block 32, as required.

The disconnection member 33 is provided to individually check a state of the system-side or field-side of each signal system when activating or maintaining a system, for example. By taking out the disconnection member 33 of the corresponding signal system from the second terminal board 30, a signal input/output system configured to transmit and receive a signal between the system-side and the field-side is mechanically disconnected.

The field control station 10 and the terminal board 30 are detachably mounted to a DIN rail. FIG. 10 shows a state where a back surface of the terminal board 30 is mounted to the DIN rail 40.

Figure 11A:
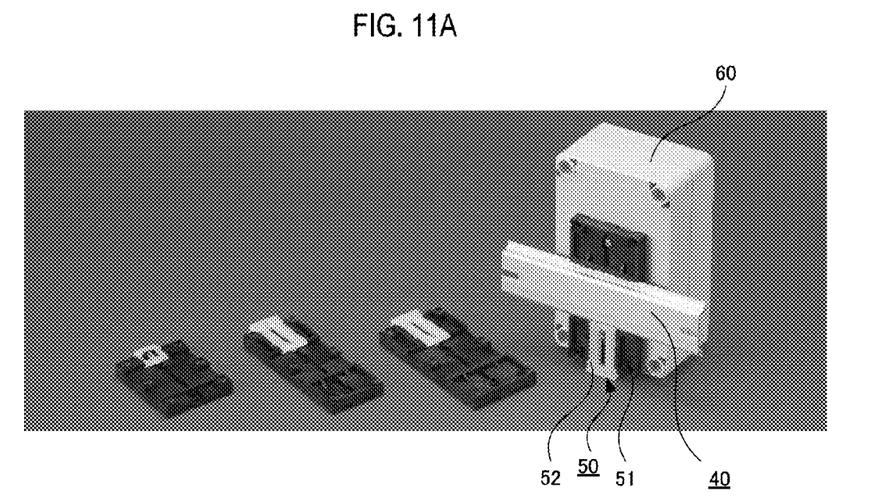
FIGS. 11A and 11B illustrate a state where an electronic device 60 is mounted to a DIN rail 40 through a mounting member 50.
Figure 11B:
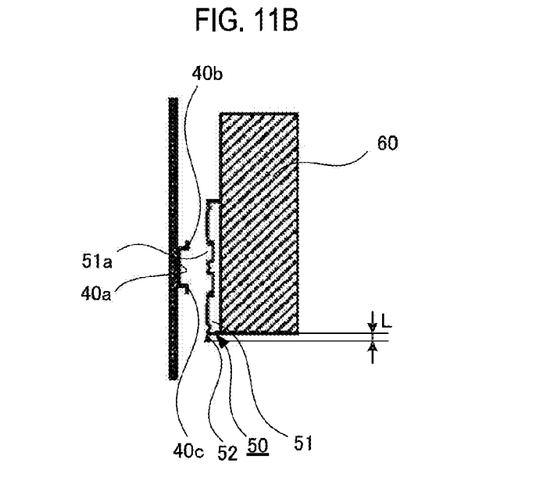

FIGS. 11A and 11B illustrates a state where an electronic device 60 is mounted to the DIN rail 40 through a mounting member 50, in which FIG. 11A is a perspective view and FIG. 11B is a schematic sectional view of FIG. 11A. In FIG. 11B, the DIN rail 40 is a top hat-shaped rail member having a flat sectional shape, whose size is standardized in accordance with the DIN standards. The DIN rail 40 has a recess portion 40a and flange sides 40b, 40c. The recess portion 40a has a rectangular sectional shape with a relatively shallow bottom surface. Each of the flange sides 40b, 40c is formed by bending outwards each of both side surfaces of the recess portion 40a facing each other in an L shape and has a relatively narrow width.

The mounting member 50 is fixed to a back surface of the electronic device 60 by a screw, and has a base member 51 and a releasing lever 52 slidably attached to the base member 51 through a spring (not shown).

The base member 51 is formed with a recess portion 51a for engaging with the flange sides 40b, 40c of the DIN rail 40.

The releasing lever 52 is slidably attached to open and close one side (a lower side) of the recess portion 51a and is urged to close the one side of the recess portion 51a by a spring (not shown) at a normal state. A depth end portion of the releasing lever 52 is formed with a tapered surface so that when the releasing lever is pressed to the DIN rail 40, it is slid downwards against the elastic force of the spring, and an end portion of a pullout-side is formed to protrude from an end portion of the base member 51 by a length L, as an operation part.

At a state shown in FIG. 11B, when detachably mounting the electronic device 60 to the DIN rail 40, the flange side 40b of the DIN rail 40 is engaged with an upper side of the recess portion 51a of the mounting member 50 fixed to the back surface of the electronic device 60 and then the lower side of the recess portion 51a of the mounting member 50 is pressed to the flange side 40c of the DIN rail 40.

The mounting member 50 is pressed to the flange side 40c of the DIN rail 40, so that the tapered surface formed at the depth end portion of the releasing lever 52 is slid along an end face of the flange side 40c, the releasing lever 52 is slid downwards and the lower side of the recess portion 51a is gradually opened.

When the flange side 40c of the DIN rail 40 rides over the tapered surface formed at the depth end portion of the releasing lever 52, it is fitted to the recess portion 51a of the mounting member 50, the releasing lever 52 is again urged by the spring to close the one side of the recess portion 51a and the flange side 40c of the DIN rail 40 is engaged to the lower side of the recess portion 51a of the mounting member 50.

When demounting the electronic device 60 mounted to the DIN rail 40, the releasing lever 52 of the mounting member 50 is pulled downwards to pull out the flange side 40c of the DIN rail 40 from the lower side of the recess portion 51a of the mounting member 50 and to release the engaged state between the flange side 40b of the DIN rail 40 and the recess portion 51a of the mounting member 50.

Figure 12A:
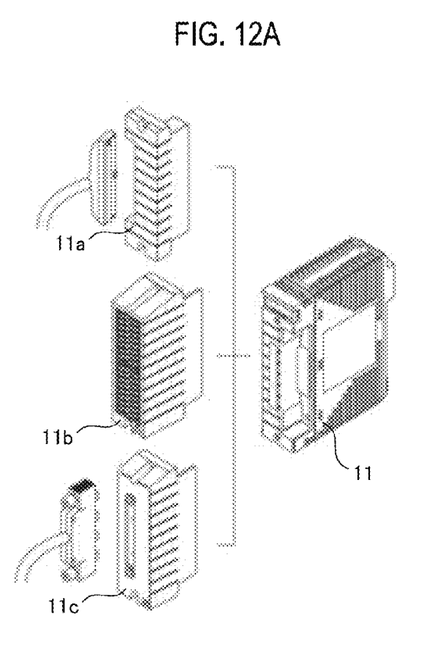
FIGS. 12A to 12C illustrate specific configuration examples of an input/output module 11 of FIG. 10.
Figure 12B:
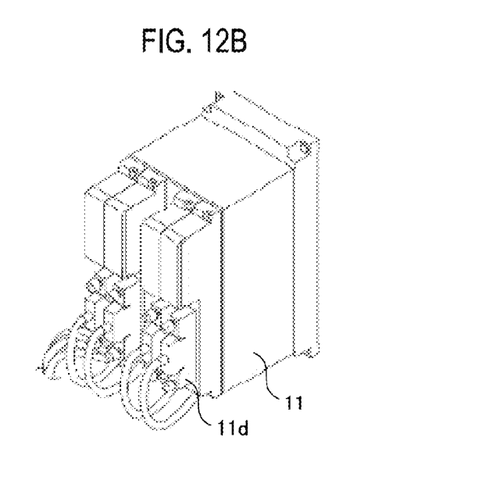
Figure 12C:
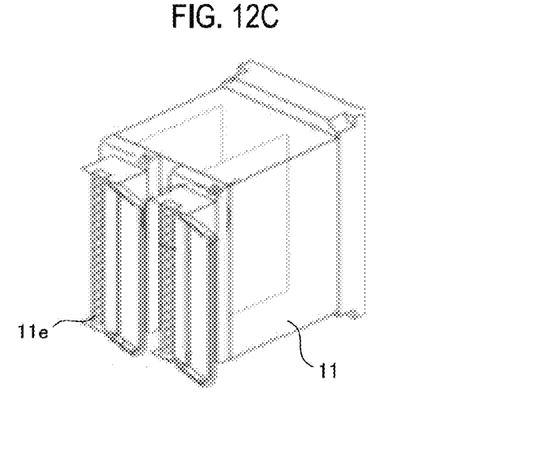

FIGS. 12A to 12C exemplify a specific configuration of the input/output module 11 of FIG. 10. FIG. 12A illustrates an example where a plurality of terminal blocks 11a, 11b, 11c configured to be detachably attached to a front surface of the input/output module 11 is prepared, and then replaced and attached to the input/output module 11 in correspondence to uses. FIG. 12B illustrates an example where a cable is connected to the input/output module 11 through a connector 11d. FIG. 12C illustrates an example where a terminal board 11e with a cover part for connecting a signal line to the input/output module 11 is provided. The input/output modules 11 are also mounted to the DIN rail (not shown).

Figures 13A, 13B:
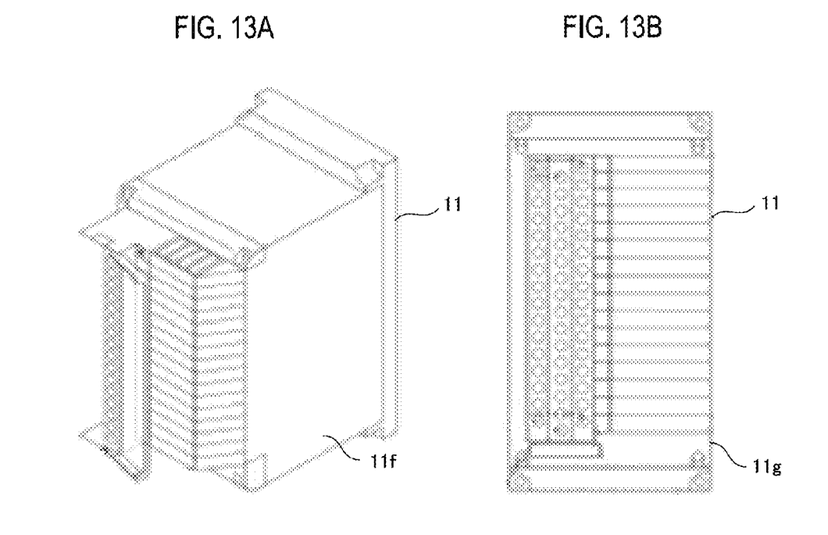
FIGS. 13A to 13C illustrate other specific configuration examples of the input/output module 11 of FIG. 10.
Figure 13C:
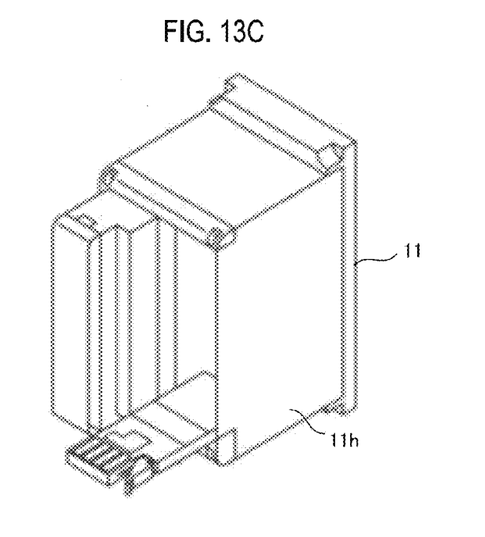

FIGS. 13A to 13C illustrate another specific configuration of the input/output module 11 of FIG. 10. FIGS. 13A and 13B illustrates a configuration where cases 11f, 11g of the input/output modules 11 having a large amount of heat generation are made of an aluminum material having high heat conductivity, and FIG. 13C illustrates a configuration where a nest (enclosure) 11h is entirely made of the aluminum material. The input/output modules 11 are also mounted to the DIN rail (not shown).

Patent Document 1 discloses a configuration of a terminal board to be mounted on a DIN rail, which can be fixed to a DIN rail with a minimum space without side slip and in which a substrate is accommodated in a metallic case.

PRIOR ART DOCUMENT

Patent Document

[Patent Document 1] Japanese Patent Application Publication No. 2012-134352A

However, according to the mounting structure for the DIN rail shown in FIGS. 11A and 11B, in order to demount the electronic device 60 mounted to the DIN rail 40, the end portion of the releasing lever 52, as an operation end, should be made to protrude from the end portion of the base member 51 by the predetermined length L so that an operator can directly operate the end portion of the releasing lever 52 slidably attached to the base member 51 of the mounting member 50. As a result, an external size is enlarged.

Also, when mounting the electronic device 60 having a wide mounting width to the DIN rail 40, the plurality of mounting members 50 having the same size and fixed to the back surface of the electronic device 60 is used. In order to demount the electronic device 60 mounted to the DIN rail 40, the releasing levers 52 of all the mounting members 50 fixed to the back surface of the electronic device 60 should be pulled out at the same time. Thus, it is very difficult to perform the corresponding operation.

Also, according to the configuration where the terminal block 11a, 11b, 11c is attached to the front surface of the input/output module 11, as shown in FIG. 12A, when accessing the front surface of the input/output module 11, the terminal block 11a, 11b, 11c becomes an obstacle, so that the operability is deteriorated.

In particular, when connecting a field wiring to the terminal block 11a, 11b, 11c, the tensile stress of the field wiring is applied to the input/output module 11, so that the input/output module 11 may be damaged. Therefore, as shown in FIG. 10, the terminal board 30 for connecting the field wiring is separately provided in some cases.

Further, as shown in FIGS. 13A to 13C, when the constitutional components of the case are all made of the aluminum material, as countermeasures against the heat, the cost increases.

SUMMARY

Exemplary embodiments of the invention provide an electronic device having high operability configured to mount and demount a base plate, to which a plurality of functional modules is detachably fitted and connected, to and from a DIN rail just by an access from a front surface of the base plate, to attach and detach the functional modules to and from the base plate mounted to the DIN rail without a mutual interference, to connect a wiring of a field device to the base plate without an influence of an external force, to effectively radiate heat from a functional module having a large amount of heat generation and to save a space through miniaturization.

An electronic device according to an exemplary embodiment, comprises:
a base plate;
a plurality of modules detachably fitted and connected to the base plate;
a plurality of mounting members configured to detachably mount the base plate to a DIN rail; and
an operation lever provided on the base plate and configured to be engaged with the mounting members and to be operable from a front surface of the base plate,
wherein when the operation lever is operated, an engaged state between the mounting members and the DIN rail is released.

The plurality of modules may be divided into groups in accordance with functions thereof, and the plurality of modules may be arranged on the base plate so that end faces of the modules configuring each group form a stepped shape in a group unit.

Any one of the module groups may include a duct for heat radiation and the other adjacent module group may be closely contacted to the heat sink.

The module groups may have input/output modules, plug-in modules each having a predetermined option function and terminal blocks, respectively.

According to the above configurations, it is possible to implement the electronic device having high operability configured to mount and demount the base plate, to which a plurality of functional modules is detachably fitted and connected, to and from the DIN rail just by the access from the front surface of the base plate, to attach and detach the respective functional modules attached on the base plate without a mutual interference and without demounting the base plate mounted to the DIN rail, to connect the wiring of the field device to the base plate without an influence of the external force, to effectively radiate heat from a functional module having a large amount of heat generation and to save the space through miniaturization.

DETAILED DESCRIPTION

Figure 1A:
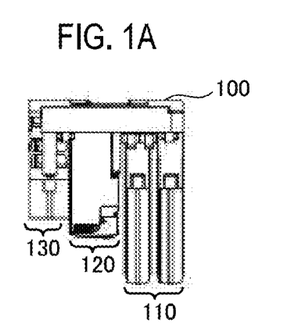
FIGS. 1A to 1D illustrate a configuration of an electronic device according to an embodiment of the present invention.
Figure 1B:
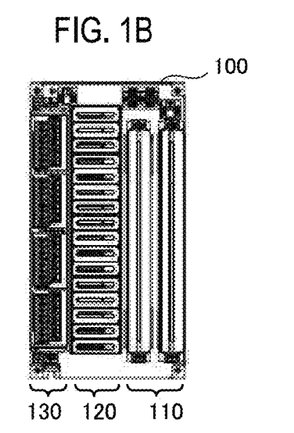
Figure 1C:
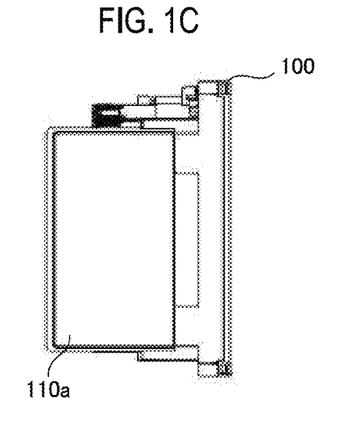
Figure 1D:
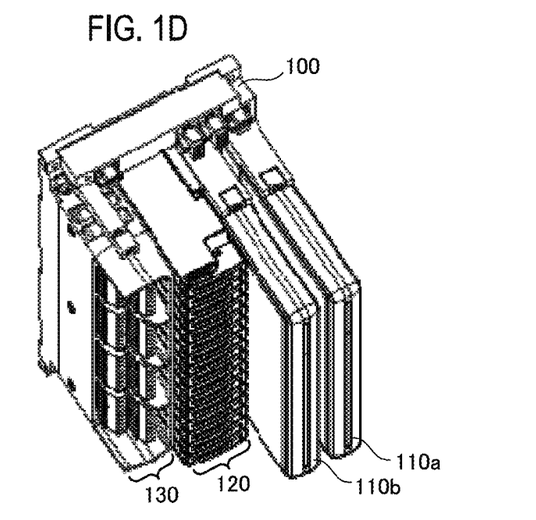
Figure 2:
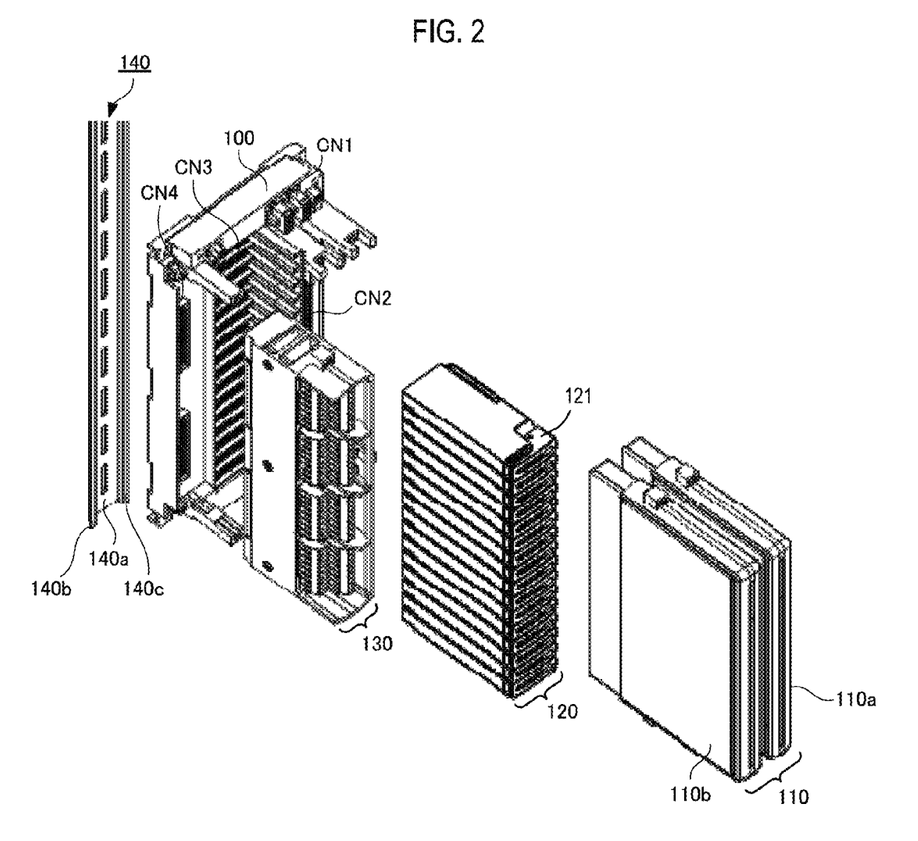
FIG. 2 is an assembly illustration of the electronic device shown in FIGS. 1A to 1D.

Hereinafter, exemplary embodiments of the present invention will be described in detail with reference to the drawings. FIGS. 1A to 1D illustrate a configuration of an electronic device according to an embodiment of the present invention, in which FIG. 1A is a top view, FIG. 1B is a front view, FIG. 1C is a side view and FIG. 1D is an overall perspective view. FIG. 2 is an assembly illustration of the electronic device shown in FIGS. 1A to 1D.

In FIGS. 1A to 1D and FIG. 2, two input/output modules 110 are fitted and connected to a front surface of a base plate 100 through connectors CN1, CN2. A plurality of plug-in modules 120 is fitted and connected to the front surface of the base plate 100 through a connector CN3. A plurality of terminal blocks 130 is fitted and connected to the front surface of the base plate 100 through a connector CN4. The two input/output modules 110 have the same function. The plurality of plug-in modules 120 serve as functional modules having predetermined option functions. The constitutional components (modules/blocks) can be relatively simply attached and detached by an access from the front surface of the base plate. In the meantime, a back surface of the base plate 100 is detachably mounted to a DIN rail 140, as described below.

Lengths of the two input/output modules 110, the plurality of plug-in modules 120 and the plurality of terminal blocks 130 in a depth direction are designed so that in a state that the input/output modules 110, the plug-in modules 120 and the terminal blocks 130 are attached to the base plate 100, respective end faces thereof form a stepped shape from one side of the base plate 100 towards the other side.

The two input/output modules 110a, 110b are configured to operate in a master/slave relation. That is, when one input/output module (for example, the input/output module 110a) operating as a master is out of order, the other input/output module (for example, the input/output module 110b) operating as a slave alternatively operates as a master, so that the input/output modules are dual-operated. Thereby, it is possible to suppress the operation stop caused due to the failure of the input/output modules 110 to the minimum.

The plug-in modules 120 are configured to add option functions of a relay, which is not implemented in the input/output modules 110, such as a signal conversion function, an insulation function, a disconnection function, a fuse function and the like, to each signal system. Each of the plug-in modules 120 has a front surface lever 121 which is provided so as to cover a front surface thereof and is rotatably attached to a shaft in the vicinity of one end thereof.

When the plug-in modules 120 are provided with a disconnection function as the option function, for example, it is not necessary to provide the disconnection member 33 provided for the terminal board 30 of the related art, and when the plug-in modules 120 are provided with a fuse function, it is not necessary to provide a fuse provided for the terminal board 30 of the related art.

Figure 3:
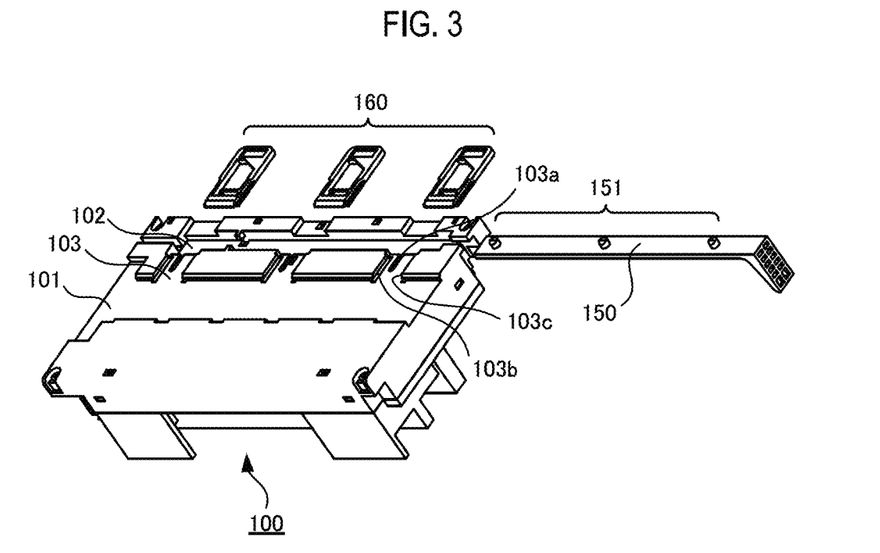
FIG. 3 is a perspective view of a back surface of a base plate 100.

FIG. 3 is a perspective view of the back surface of the base plate 100. The back surface of the base plate 100 is provided with a first recess portion 101, a second recess portion 102 and three third recess portions 103. The first recess portion 101 is formed at a substantial center part of the base plate 100, and extends in a longitudinal direction with a relatively wide width so that the DIN rail 140 can be fitted in the first recess portion 101. The second recess portion 102 is formed adjacent to one side of the base plate 100 and extends in the longitudinal direction in parallel with the first recess portion 101. The second recess portion 102 has a width narrower than the first recess portion 101. An operation lever 150 is slidably fitted in the second recess portion 102. The third recess portions 103 are discretely formed to be orthogonal to the first recess portion 101 and the second recess portion 102. Mounting members 160 for detachably mounting the base plate 100 to the DIN rail 140 are slidably fitted in the third recess portions 103.

A bottom surface of the third recess portion 103 is provided with a guide recess 103a for guiding a sliding direction of the mounting member 160 in a state that the mounting member 160 is slidably fitted to the third recess portion 103. Both wall surfaces of the third recess portion 103 are provided with guide portions 103b, 103c configured to slidably fit therein stepped portions 160d, 160e provided on both side surfaces of the mounting member 160.

The operation lever 150 is operable from the front surface of the base plate 100 and is made of substantially L-shaped plate. The operation lever 150 is provided with three cylindrical projections 151 on a long part of the substantially L-shaped plate at the same interval as that of the three recess portions 103. The three cylindrical projections 151 mechanically couple to the mounting members 160 which have the same shape and are fixed to the three recess portions 103. The operation laver 150 is attached to the base plate 100 in a state that a short part of the substantially L-shaped plate projects toward the front surface from the back surface of the base plate 100.

Figure 4:
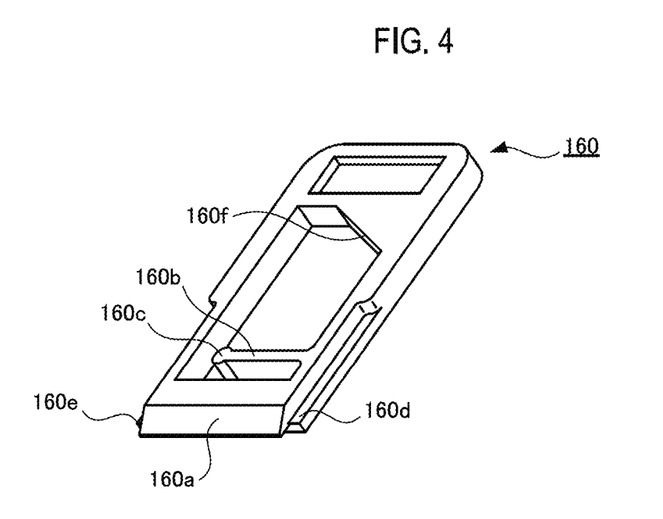
FIG. 4 illustrates a configuration of a mounting member 160.

FIG. 4 illustrates a configuration of the mounting member 160. The mounting member 160 is integrally made of plastic to have a substantially rectangular flat plate frame shape and has a tapered surface 160a formed at one end thereof, and a cantilever moveable piece 160b formed in the vicinity of an end portion of the tapered surface 160a. The cantilever moveable piece 160b has elasticity and serves as a substantial plate spring. An end portion of the moveable piece 160b is formed integrally with a cylindrical engaging portion 160c configured to be fitted with the guide recess 103a provided on the bottom surface of the third recess portion 103.

Both side surfaces of the tapered surface 160a are formed with the stepped portions 160d, 160e configured to be slidably fitted with the guide portions 103b, 103c provided on both wall surfaces of the third recess portion 103. An inclined side 160f is provided at a part in a depth direction of a side of the frame part to which the moveable piece 160b is fixed.

When attaching the operation lever 150 and the mounting members 160 to the base plate 100, the operation lever 150 is inserted until it collides with an end portion of the second recess portion 102 with the projections 151 of the operation lever 150 protruding upwards.

Thereafter, the mounting members 160 are movably attached to the third recess portions 103, respectively. Specifically, the stepped portions 160d, 160e formed on both side surfaces of the mounting member 160 are slidably fitted to the guide portions 103b, 103c provided on both wall surfaces of the third recess portion 103, the cylindrical engaging portion 160c formed integrally with the end portion of the moveable piece 160b is fitted into the guide recess 103a provided on the bottom surface of the third recess portion 103.

At a state where the operation lever 150 and the mounting members 160 are incorporated with the base plate 100 in this way, the operation lever 150 is pressed in a left direction of FIG. 3 by the elastic force of the moveable pieces 160b of the mounting members 160.

Thereby, the end portions of the mounting members 160 at which the tapered surfaces 160a are formed protrude from one wall surface 101a of the recess portion 101 and form an engaging recess 101b, to which a flange side 140c of the DIN rail 140 is fitted and engaged, between the end portions of the mounting members 160 and the bottom surface of the first recess portion 101. In the meantime, a corner portion of an opening-side of the wall surface 101a is chamfered to have a substantial arc shape so that the flange side 140c of the DIN rail 140 can be smoothly attached and detached.

A protrusion side 101d having an arc section is formed in the vicinity of an opening-side of the other wall surface 101c of the first recess portion 101, and an engaging recess 101e for engaging one flange side 140b of the DIN rail 140 is formed between the protrusion side 101d and the bottom surface of the recess portion 101.

Figure 5A:
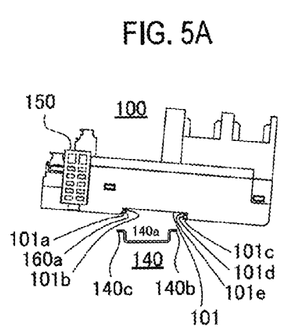
FIGS. 5A to 5C illustrate a sequence of mounting a base plate having an operation lever 150 and the mounting members 160 shown in FIG. 3 incorporated thereto to a DIN rail 140, as seen from below.
Figure 5B:
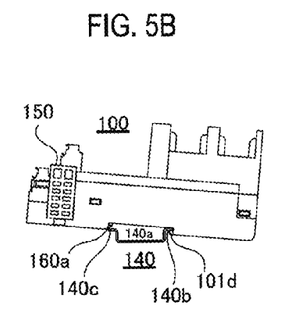
Figure 5C:
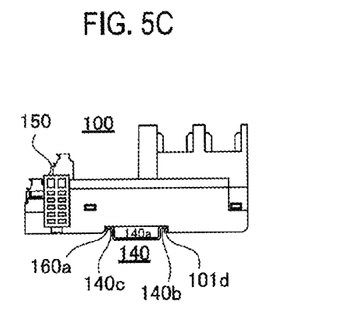

FIGS. 5A to 5C illustrate a sequence of mounting the base plate 100 having the operation lever 150 and the mounting members 160 shown in FIG. 3 to the DIN rail 140, as seen from below.

First, as shown in FIG. 5A, the one flange side 140b of the DIN rail 140 is fitted and engaged to the engaging recess 101e formed between the protrusion side 101d of the wall surface of the recess portion 101 and the bottom surface of the recess portion 101.

Subsequently, as shown in FIG. 5B, the entire base plate 100 is pressed to the DIN rail 140. Thereby, the tapered surfaces of the mounting members 160 attached to the base plate 100 are slid along the end face of the other flange side 140c of the DIN rail 140, and the other flange side 140c of the DIN rail 140 is fitted to the engaging recess 101b formed between the tapered surfaces 160a and the bottom surface of the recess portion 101.

As a result, as shown in FIG. 5C, the base plate 100 is engaged and fixed to the DIN rail 140.

Figure 6A:
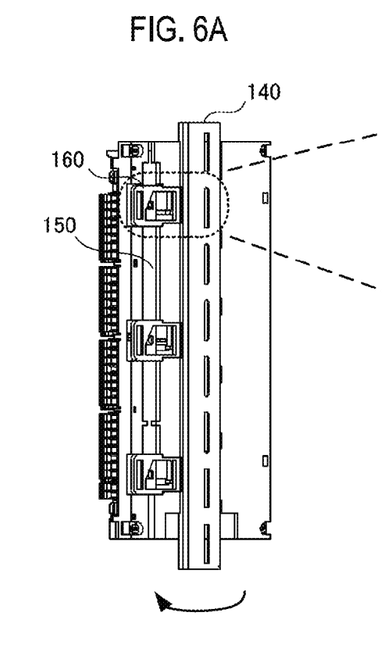
FIGS. 6A to 6D illustrate an operation of demounting the base plate 100 mounted to the DIN rail 140.
Figure 6B:
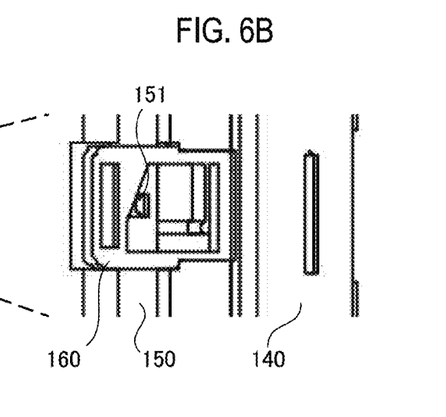
Figure 6C:
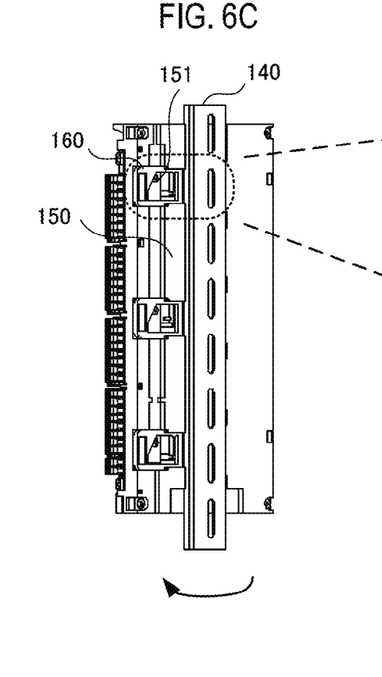
Figure 6D:
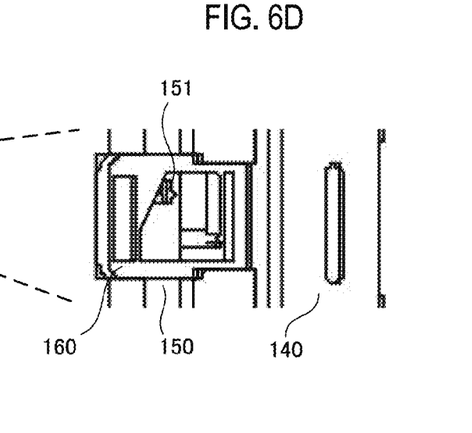

FIGS. 6A to 6D illustrate an operation of demounting the base plate 100 mounted to the DIN rail 140, in which FIG. 6A illustrates a state where the base plate 100 is mounted to the DIN rail 140, FIG. B is a partial enlarged view of FIG. 6A, FIG. 6C illustrates a state where the base plate 100 is demounted from the DIN rail 140 and FIG. 6D is a partial enlarged view of FIG. 6C.

FIGS. 6A and 6B illustrate a normal state where the operation lever 150 is not pulled. At this state, the three projections 151 of the operation lever 150 are fitted to slide along the inclined sides 160f of the corresponding mounting members 160, and the operation lever 150 is pressed to a predetermined position at which it collides with the end portion of the second recess portion 102 by the elastic force of the moveable pieces 160b of the mounting members 160.

At this state, as described above, the one flange side 140b of the DIN rail 140 is fitted to the engaging recess 101e formed between the protrusion side 101d of the one wall surface of the recess portion 101 and the bottom surface of the recess portion 101 and the other flange side 140c of the DIN rail 140 is fitted to the engaging recess 101b formed between the tapered surfaces 160a of the three mounting members 160 and the bottom surface of the recess portion 101, so that the base plate 100 is stably mounted to the DIN rail 140.

FIGS. 6C and 6D illustrate a state where the operation lever 150 is pulled from a predetermined position of the second recess portion 102 against the elastic force of the moveable pieces 160b of the three mounting members 160. As the operation lever 150 is pulled, the three projections 151 provided for the operation lever 150 are slid along the inclined sides 160f of the corresponding mounting members 160 and the three mounting members 160 are also slid on the third recess portions 103 at the same time so that the end portions of the three mounting members 160 moves away from the flange side 140c of the DIN rail 140.

Thereby, the engaging recess 101b formed between the tapered surfaces 160a of the three mounting members 160 and the bottom surface of the recess portion 101 temporarily disappears, so that the mounted state of the base plate 100 to the DIN rail 140 with the mounting members 160 being interposed therebetween is released and the base plate 100 can be thus demounted from the DIN rail 140.

Figure 7:
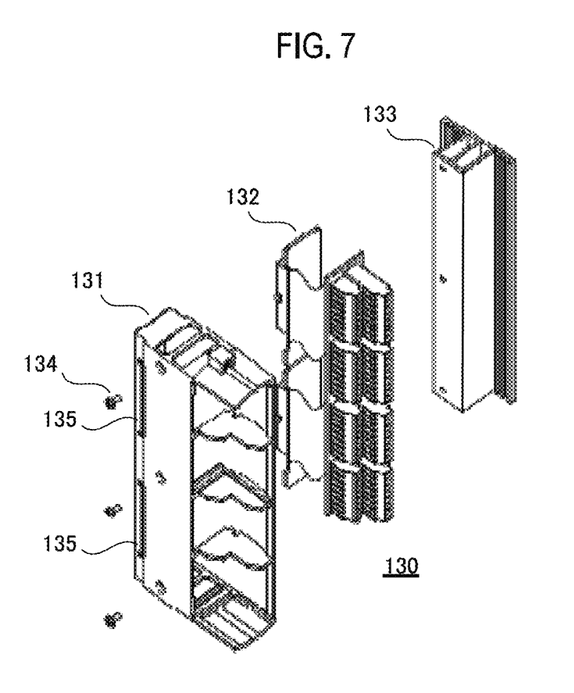
FIG. 7 illustrates a configuration of a terminal block 130.

FIG. 7 illustrates a configuration of the terminal block 130. The terminal block 130 is configured so that a substrate 132 is positioned between a side cover 131 and a heat sink 133 and they are fixed by screws 134. As the heat sink 133 of the terminal block 130, an aluminum irregular-shaped material having a square tube-shaped portion (duct) formed to enable cooling wind to flow therethrough is used.

Figure 8A:
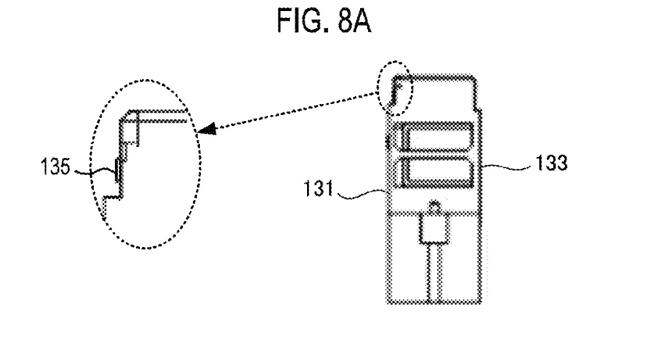
FIGS. 8A to 8C illustrate the configuration of the terminal block 130.
Figure 8B:
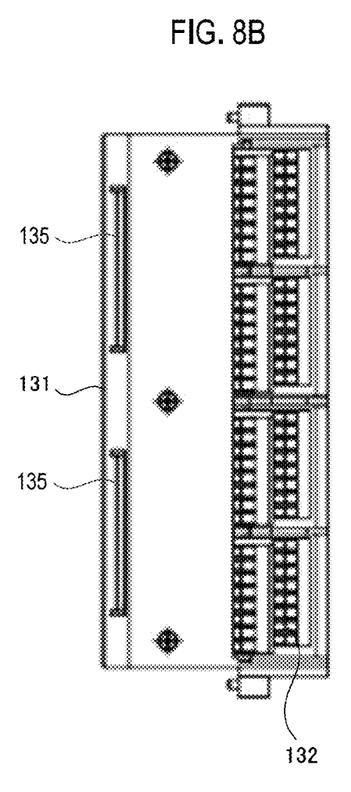
Figure 8C:
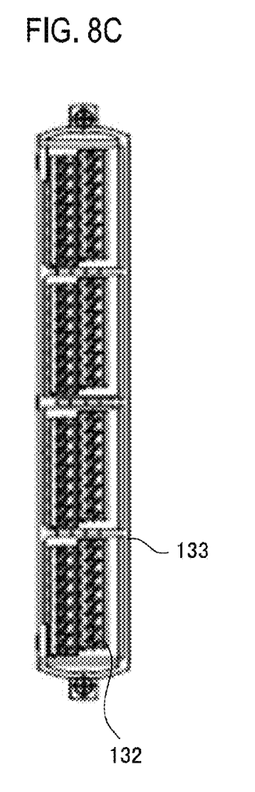

FIGS. 8A to 8C also illustrate the configuration of the terminal block 130, in which FIG. 8A is a top view, FIG. 8B is a side view and FIG. 8C is a front view. The side cover 131 of the terminal block 130 is provided with bent parts 135 serving as a substantial plate spring and bent into a crank shape.

Figure 9A:
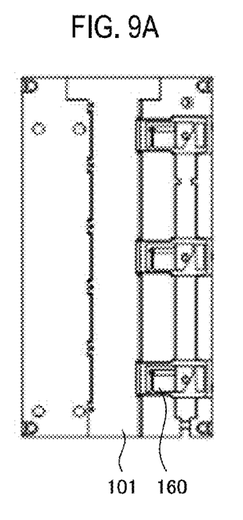
FIGS. 9A to 9F illustrate a function of a plate spring 135.
Figure 9B:
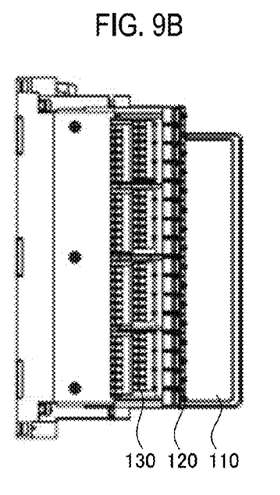
Figure 9C:
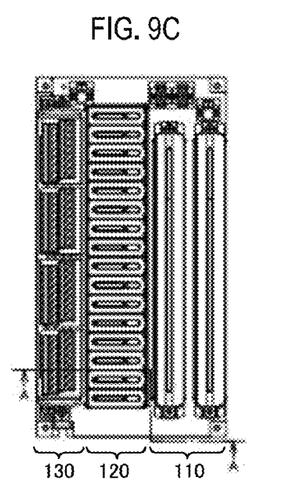
Figures 9D, 9E, 9F:
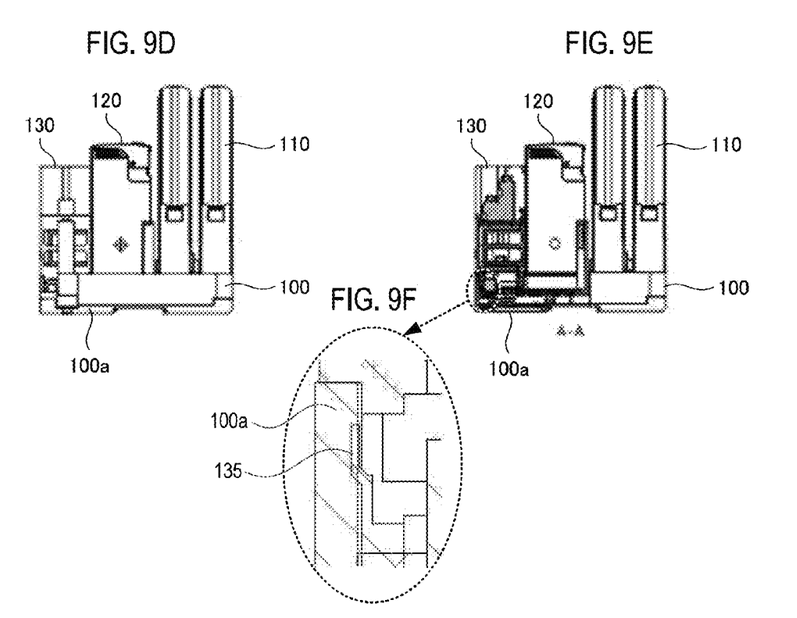

FIGS. 9A to 9F illustrate a function of the bent part 135, in which FIG. 9A is a back surface view, FIG. 9B is a side view, FIG. 9C is a front view, FIG. 9D is a top view, FIG. 9E is a sectional view taken along a line A-A of FIG. 9C, and FIG. 9F is a partial enlarged view of FIG. 9E. As shown in FIG. 9F, the bent part 135 is configured to interfere with a case 100a of the base plate 100 and to generate a force of pressing the heat sink 133 of the terminal block 130 towards the plug-in modules 120 when attaching the terminal block 130 to the base plate 100.

By the above structure, the heat sink 133 of the terminal block 130 is securely contacted to the plug-in modules 120, thereby improving the heat radiation effect of the plug-in modules 120.

The input/output module 110 may be inserted into the input/output module 110a-side, the input/output module 110bb-side or both the input/output modules 110a, 110b, as required. Therefore, it is not possible to determine an amount of heat generation and heat radiation performance thereof. Thus, a heat radiation mechanism is provided for the terminal block 130 having no heat generation member, so that it is possible to accomplish the stable heat radiation effect all the time.

Also, it is possible to integrate the field control station 10 and the terminal board 30 of the related art shown in FIG. 10, so that it is possible to save the space.

Also, as shown in FIGS. 1A to 1D and FIG. 2, it is possible to detachably fit and connect the input/output modules 110, the plurality of plug-in modules 120 having the predetermined option functions and the plurality of terminal blocks 130 to the base plate 100 which accessing the base plate 100 from the front surface thereof so that a structure having no mutual interference can be implemented.

Also, as shown in FIGS. 5A to 5C and 6A to 6D, when fixing the base plate 100 to the DIN rail 140, the front surface of the base plate 100 has only to be pressed to the DIN rail 140, and when demounting the base plate 100 from the DIN rail 140, the operation lever 150 has only to be pulled out. That is, it is possible to implement a structure where the base plate 100 can be mounted and demounted to and from the DIN rail 140 just by the access from the front surface of the base plate 100.

Also, the mounting member 160 configured to fix the base plate 100 to the DIN rail 140 has a structure enabling the base plate 100 to be demounted from the DIN rail 140 without protruding from an external shape of the apparatus and can make the apparatus small. Also, it is possible to operate the plurality of mounting members 160 at the same time by the operation of the one operation lever 150.

Also, as shown in FIG. 7, in order to radiate the heat from the plurality of plug-in modules 120, the heat sink 133 is embedded in the terminal block 130 to efficiently implement the countermeasures against the heat with the minimum space.

For a recent control system, it is required to perform a complex process control. In order to perform the complex process control, a variety of signals should be transmitted and received between a variety of field devices and a controller.

Therefore, an input/output module configured to convert the signals between the variety of field devices and the controller into a desired form is required, and the input/output module is required to have an ability of converting the various signals. Also, since an absolute amount of signal lines increases, the miniaturization for reducing a rack configured to mount the electronic device thereto and a cabinet configured to accommodate therein the electronic device is also required.

In the meantime, the input/output module configuring the electronic device of the present invention is repaired and changed in many cases, as compared to a controller used for a process control system. The reasons are as follows: since the setup place of the electronic device including the input/output module is close to a field of the process control, the input/output module is likely to be damaged due to an external noise and the like, and a physical change is required depending on addition and/or deletion of the field devices in many cases, for example.

Furthermore, since it is required to suppress the influence on the controller and the other control target upon the change, a base plate, which is independent for each control target unit and has a predetermined functional module group fitted and connected thereto is preferably replaced.

The above-described present invention can implement the electronic device satisfying the above requirement and having high operability configured to mount and demount the base plate, to which a plurality of functional modules is detachably fitted and connected, to and from the DIN rail just by the access from the front surface of the base plate, to attach and detach the respective functional modules mounted on the base plate without a mutual interference and without demounting the base plate mounted to the DIN rail, to connect the wiring with the field device to the base plate without an influence of the external force, to effectively radiate heat from a functional module having a large amount of heat generation and to save the space through miniaturization.

What is claimed is:

1. An electronic device comprising:
   a base plate;
   a plurality of modules detachably fitted and connected to the base plate;
   a plurality of mounting members configured to detachably mount the base plate to a DIN rail; and
   an operation lever provided on the base plate and configured to be engaged with the mounting members and to be operable from a front surface of the base plate,
   wherein when the operation lever is operated, an engaged state between the mounting members and the DIN rail is released;
   wherein the base plate comprises a first recess portion which is formed in a longitudinal direction and in which the DIN rail is fitted, a second recess portion formed in the longitudinal direction in parallel with the first recess portion, and third recess portions, formed to be orthogonal to the first recess portion and the second recess portion, provided in a back surface of the base plate,
   wherein the plurality of modules are detachably fitted and connected to a front surface of the base plate,
   wherein the plurality of mounting members are configured to be slidably fitted in the third recess portions of the base plate,
   wherein the DIN rail is configured to be fitted in the first recess portion,
   wherein the operation lever is configured to be slidably fitted in the second recess portion of the base plate,
   wherein when the operation lever is operated by being pulled from the predetermined position of the second recess portion, the mounting members are slid on the third recess portions so as to move away from the DIN rail.

2. The electronic device according to claim 1, wherein the plurality of modules is divided into groups in accordance with functions thereof, and
   wherein the plurality of modules is arranged on the base plate so that end faces of the modules configuring each group form a stepped shape in a group unit.

3. The electronic device according to claim 2, wherein any one of the module groups includes a duct for heat radiation and the other adjacent module group is closely contacted to the duct.

4. The electronic device according to claim 2, wherein the module groups have input/output modules, plug-in modules each having a predetermined option function and terminal blocks, respectively.

5. The electronic device according to claim 3, wherein the module groups have input/output modules, plug-in modules each having a predetermined option function and terminal blocks, respectively.

6. The electronic device according to claim 1, wherein the at least one module is detachably fitted and connected to the front surface of the base plate.

7. The electronic device according to claim 1, wherein the base plate comprises a recess configured for fitment of the operation lever.

8. The electronic device according to claim 1, wherein the plurality of mounting members are configured to slide orthogonally to a direction of movement of the operation lever.

9. The electronic device according to claim 1, wherein the operation lever is configured to be pressed to the end portion of the second recess portion by the elastic force of the mounting members.

* * * * *